(12) United States Patent
Meyers et al.

(10) Patent No.: US 6,920,168 B1
(45) Date of Patent: Jul. 19, 2005

(54) OPTICAL ASSEMBLY

(75) Inventors: Mark M Meyers, Doylestown, PA (US); Stephen O'Brien, Lower Macungie Township, PA (US)

(73) Assignee: TriQuint Technology Holding Co., Hillsboro, OR (US)

(*) Notice: Subject to any disclaimer, the term of this patent is extended or adjusted under 35 U.S.C. 154(b) by 0 days.

(21) Appl. No.: 09/510,038

(22) Filed: Feb. 22, 2000

(51) Int. Cl.[7] .................................................. H01S 5/00
(52) U.S. Cl. ........................ 372/48; 372/102; 372/43; 372/50; 372/32
(58) Field of Search ............................. 372/48, 32, 50, 372/36, 29.011

(56) References Cited

U.S. PATENT DOCUMENTS

| | | | |
|---|---|---|---|
| 4,692,207 A | | 9/1987 | Bouadma et al. ............ 156/649 |
| 4,807,238 A | * | 2/1989 | Yokomori ..................... 372/32 |
| 5,446,719 A | * | 8/1995 | Yoshida ....................... 369/116 |
| 5,477,325 A | * | 12/1995 | Miyashita et al. ........... 356/630 |
| 5,694,048 A | * | 12/1997 | Boudreau ..................... 324/752 |
| 5,854,867 A | * | 12/1998 | Lee .............................. 385/49 |
| 5,881,193 A | | 3/1999 | Anigbo et al. ................ 385/93 |
| 5,883,988 A | * | 3/1999 | Yamamoto .................... 385/14 |
| 6,185,239 B1 | * | 2/2001 | Ijuin ............................ 372/50 |
| 6,219,470 B1 | * | 4/2001 | Tu ............................... 385/14 |
| 6,236,669 B1 | * | 5/2001 | Nakanishi .................... 372/43 |
| 6,259,713 B1 | * | 7/2001 | Hwu ............................ 372/36 |
| 6,278,721 B1 | * | 8/2001 | Joyce ........................... 372/102 |

FOREIGN PATENT DOCUMENTS

| | | | |
|---|---|---|---|
| DE | 3442188 | 5/1986 | ........... H01S/3/133 |
| DE | 19616969 | 10/1997 | ............. G02B/6/42 |
| JP | 61272987 | 3/1986 | ............. H01S/3/18 |
| JP | 62089378 | 4/1987 | ........... H01S/3/133 |

OTHER PUBLICATIONS

European Search Report, Jul. 24, 2001—with references as listed above.

* cited by examiner

*Primary Examiner*—Minsun Oh Harvey
*Assistant Examiner*—Dung Nguyen
(74) *Attorney, Agent, or Firm*—Lester Birnbaum

(57) ABSTRACT

The invention, in accordance with one aspect, is an optical assembly including a substrate, a light emitting device mounted over a major surface of the substrate and having a back face, at least one channel formed in the substrate near the back face of the light emitting device, and at least one photodetector optically coupled to the light emitted from the back face. The channel includes at least one surface adapted to receive a portion of the back face light and reflect it away from the photodetector so that the photodetector receives primarily direct light from the back face.

16 Claims, 2 Drawing Sheets

OPTICAL ASSEMBLY

FIELD OF THE INVENTION

This invention relates to optical assemblies, and in particular to assembly structures which improve the detection of light from an optical device mounted on a substrate, as well as a method of forming such assemblies, and a transmitter and an optical network incorporating such assemblies.

BACKGROUND OF THE INVENTION

Optical networks are the subject of increasing interest in telecommunications primarily due to their immense information handling capacity. One of the key elements of such a network is the wavelength tunable laser which allows the emission of several wavelengths from a single laser, and thereby provides multiple channels for transmission. In at least one form of the laser, light from the backface of the laser is used to lock the laser light onto the desired wavelengths.

In many types of present optical assemblies, the laser is mounted on a substrate, which is usually silicon, along with a lens near the front face, and a photodetector near the back face. A channel is used to reflect light from the back face onto the photodetector for monitoring the back face light. (See, e.g., U.S. Pat. No. 5,881,193 issued to Anigbo, which is incorporated by reference herein.) A problem arises when the same type of substrate is used in an assembly where the back face light is employed for locking the light emission wavelength, as opposed to simply monitoring the back face light intensity. A photodetctor array used for locking is placed adjacent to the channel, and receives both direct light from the back face and reflected light from the channel. The secondary "beamlets" can corrupt the wavelength monitoring signal, which reduces the ability to lock the output wavelength of the laser. A different type of substrate might be employed, but it is more economical for most manufacturers to continue using the same type of substrate used for other devices.

It is desirable, therefore, to provide an assembly which increases the quality of the detected back face light for locking the wavelength of the emitted light and for other uses.

SUMMARY OF THE INVENTION

The invention, in accordance with one aspect, is an optical assembly including a substrate, a light emitting device mounted over a major surface of the substrate and having a face, at least one channel formed in the substrate near the back face of the light emitting device, and at least one photodetector optically coupled to the light emitted from the face. The channel includes at least one surface adapted to receive a portion of the face light and reflect it away from the photodetector so that the photodetector receives primarily direct light from the back face.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
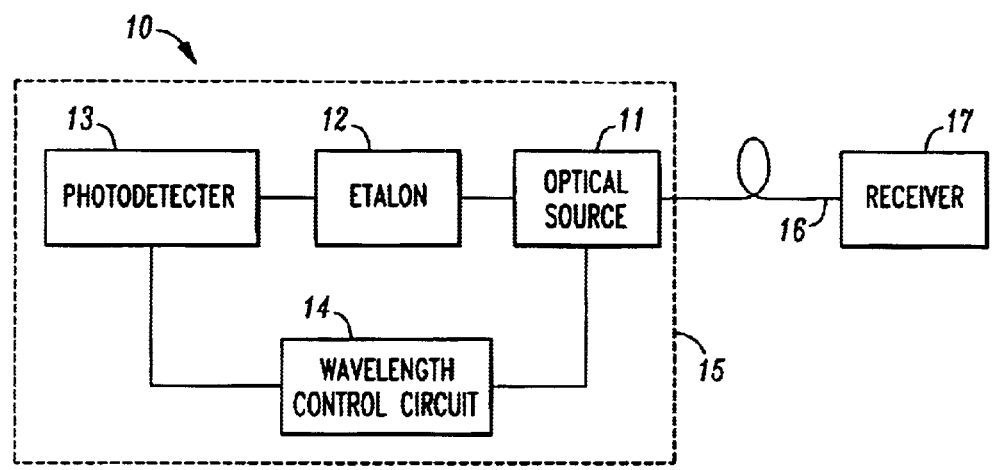
FIG. 1 is a schematic diagram of a portion of an optical network including an optical assembly in accordance with an embodiment of the invention.

FIG. 1 illustrates a portion of a typical optical network incorporating principles of the invention. An optical transmitter, 15, provides an optical signal which is transmitted over an optical fiber, 16, to a receiver, 17, where the optical signal is converted to an electrical signal. Amplifiers (not shown) such as Erbium-doped fiber amplifiers, as well as other elements, can also be included between the transmitter, 15, and the receiver, 13.

The transmitter, 15 includes a source, 11, of the optical signal, which may include a semiconductor laser or other optical device. The laser typically emits the light signal from a front face and also emits light from a back face. The back face light is coupled to a device, 12, where transmission is wavelength dependent such as a Fabry-Perot etalon, such that the optical output of the filter is a function of the wavelength of the back face light. The output of the filter is optically coupled to one or more photodetectors, 13, which convert the light to an electrical signal. The resulting electrical signal is coupled to a wavelength control circuit, 14, which produces an electrical signal in response to the photodetector signal. The output from the wavelength control signal can be used, for example, to control the bias to the laser, or to control a thermo electric cooler to adjust either the bias or the temperature in order to lock the laser signal to desired wavelengths. In many systems, it may be desirable to split the back face signal into two beams, with one serving as a reference signal. The wavelength control circuitry may include analog and/or digital circuitry.

Figure 2:
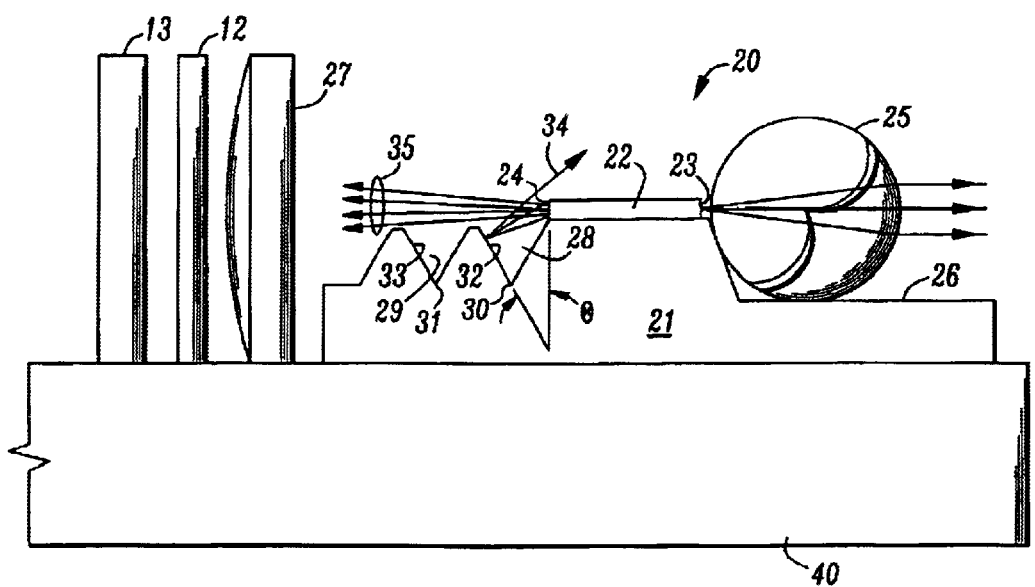
FIG. 2 is a cross sectional view of a portion of an optical assembly in accordance with an embodiment of the invention.
Figure 3:
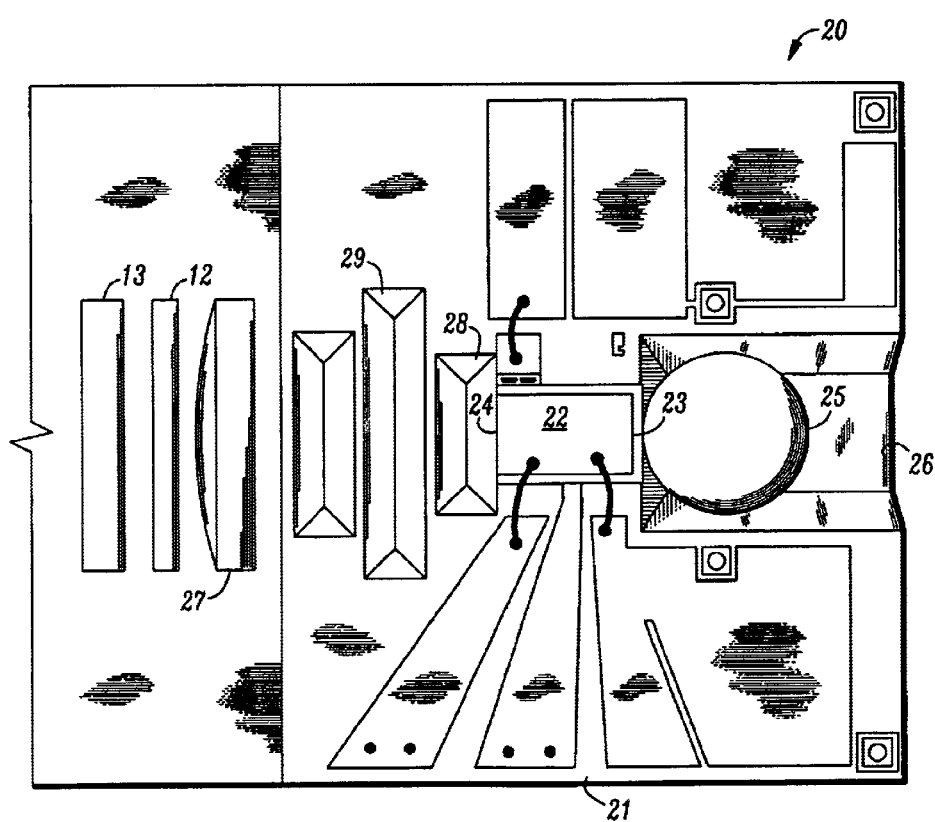
FIG. 3 is a plan view of a portion of the assembly illustrated in FIG. 2.

FIG. 2 illustrates an optical assembly, 20, which may be incorporated into the optical source, 11, in accordance with an embodiment of the invention and FIG. 3 is a plan view of a portion of the optical assembly. The assembly includes a substrate, 21, which is preferably silicon or other crystallographic material. A light emitting device, 22, is preferably mounted on the top major surface of the substrate. In this example, the device is a semiconductor laser, such as an Electro-absorption Modulated (EML) laser or a Distributed Feedback (DFB) laser, but could be other types of light emitting devices. The device preferably has a front face, 23, and a back face, 24, from which light is emitted. The front face light usually comprises the signal light which is coupled to the network, while the back face light is used for determining the wavelength of the emitted light for purposes of locking the signal light to a desired wavelength. A modulator (not shown) which is integral with the laser, as in an Electroabsorption Modulated Laser, or separate therefrom, can also be included on the top surface.

A spherical lens, 25, (ball lens) is preferably mounted within a channel, 26, etched in the substrate surface in close proximity to the laser, 22. The lens, 25 functions to collimate the light emitted from the front face so that the light can be coupled to the optical fiber (16 of FIG. 1). Desirably, an optical isolator (not shown) may be placed between the lens 25 and the fiber.

At least one additional, and in this example, two channels, 28 and 29, were formed in the surface of the substrate in close proximity to, and in this example adjacent to, the rear face, 24, of the laser. It will be recognized that in certain prior designs, a v-channel was formed with sloping end wall so that light from the back face would be reflected from the bottom and end wall onto the major surface of a photodetector which was mounted on the top surface of the substrate extending over the channel. (See U.S. Pat. No. 5,881,193, previously cited.) For purposes of locking, the photodetector, 13, preferably includes an array of photodetectors which receive light from different portions of an etalon, 12, through a collimating lens, 27, all of which are mounted in a ceramic carrier, 40, in close proximity to the back face. In the presently preferred design, the channels, 28 and 29, comprise at least two, V-grooves, with their vertexes, 30 and 31, essentially parallel to the rear face, 24, of the laser, 22. This provides at least one surface, and in this example two surfaces, 32 and 33, which are at an angle, eg., 35.3, other than 90 degrees with respect to the rear face of the laser, and preferably no greater than 60 degrees to the rear face. Consequently, the surfaces, 32 and 33, are oriented such that light from the rear face which is propogated toward the channel, 28, represented by arrow 34, is reflected away from the photodetector, 13, while direct light, represented by arrows, 35, is incident upon the photodetector. In this embodiment, the first V-groove surface, 32, reflects most of the light propagating toward the substrate, 21, while the second V-groove surface, 33, reflects glancing light from the back face which propagates past the first V-groove. The photodetectors, therefore, receive primarily only direct light from the laser (i.e. non-reflected light) which enhances the quality of the detected light. Preferably, the light received by the photodetectors is at least 97 percent direct light. One effect of the V-grooves, therefore, is to act as an integral beam dump which deflects undesired portions of the beam from the field of view of the wavelength control circuitry (14 of FIG. 1.)

In a typical example, the major surface of the silicon substrate, 21, lies in the <100> crystallographic plane, and the surfaces, 32 and 33, would lie in the <111> crystallographic planes as a result of the etching of the top surface. This forms an angle, θ, of approximately 35.3 degrees with the back face. The light emitted from the back face usually covers a range of angles in the range 0–35 degrees. Light from the back face which is incident on the silicon in the V-grooves at an angle larger than the critical angle of silicon (approximately 16 degrees) is reflected. Light incident at less than this angle is partially transmitted and partially reflected, but is still removed from the field of view of the photodetectors. An appropriate range of angles, θ, would be 10–75 degrees.

The assembly, 20, may be fabricated generally by standard bonding and etching techniques. The channels, 27 and 28, may be formed for example using a photoresist mask and wet etching.

Various modifications of the invention as described are possible. For example, the undesired light need not be reflected upward as shown, but could be reflected in other directions by an appropriate choice of the orientation of the reflecting surfaces, 32 and 33, as long as the light is reflected away from the photodetector it should also be understood that the term "V-groove" includes truncated forms of the V-grooves illustrated in FIG. 1, i.e. the bottom of the groove is flat.

What is claimed is:

1. An optical assembly comprising:
   a substrate;
   a light emitting device mounted over a major surface of the substrate and having a face;
   at least one channel formed in the substrate near the face of the light emitting device; and
   at least one photodetector optically coupled to the light emitted from the face, the channel including at least one surface spaced from the face and positioned to receive only adapted to receive only a portion of the face light and oriented at an angle to the face to reflect said portion away from the photodetector so that the photodetector receives primarily direct light from the face.

2. The assembly according to claim 1 wherein the substrate comprises silicon.

3. The assembly according to claim 1 wherein the light emitting device comprises a semiconductor laser.

4. The assembly according to claim 1 wherein the channel comprises at least one V-groove formed in the substrate.

5. The assembly according to claim 4 wherein the V-groove has a vertex which is essentially parallel to the face.

6. The assembly according to claim 5 wherein the V-groove has a sloped wall facing the face which makes an angle within the range 10 to 75 degrees with the face.

7. The assembly according to claim 4 wherein the substrate is silicon and the V-groove has surfaces in the <111> crystallographic plane.

8. The assembly according to claim 4 wherein the channels comprise at least two V-grooves.

9. The assembly according to claim 1 wherein the face is the back face of the device.

10. An optical assembly comprising:
    a substrate comprising silicon;
    a semiconductor laser mounted over a major surface of the substrate and having a back face;
    at least one V-groove formed in the substrate near the back face of the laser, the groove including surfaces formed in the <111> crystallographic plane of the substrate; and
    an array of photo detectors optically coupled to light from the back face of the laser, at least one of the surfaces of the V-groove spaced from the back face and positioned to receive only a portion of the light from the backface and oriented at an angle to the back face to reflect said portion away from the photodetectors so that the photodetectors receive only direct light from the back face.

11. An optical transmitter comprising an optical assembly, an optical filter optically coupled to the assembly, at least one photo detector optically coupled to the filter, and control circuitry electrically coupled to the photo detector, the assembly comprising:
    a substrate;
    a light emitting device mounted over a major surface of the substrate and having a at least one channel formed in the substrate near the face of the light emitting device, the photodetector being optically coupled to the light emitted from the face, and the channel including at least one surface spaced from the face and positioned to receive only a portion of the face light and oriented at an angle to the face to reflect said portion away from the photodetector so that the photodetector receives primarily direct light from the face.

12. An optical network comprising a transmitter, an optical fiber optically coupled to the transmitter, and a receiver optically coupled to the fiber, the transmitter comprising an optical assembly comprising:
    a substrate;
    a light emitting device mounted over a major surface of the substrate and having a at least one channel formed in the substrate near the face of the light emitting device; and at least one photodetector optically coupled to the light emitted from the face, the channel including at least one surface spaced from the face and positioned to receive only a portion of the face light and oriented at an angle to the face to reflect said portion away from the photodetector so that the photodetector receives primarily direct light from the back face.

13. A method of forming an optical assembly comprising the steps of:

mounting a light emitting device having a face over a major surface of a substrate;

mounting a photo detector so as to receive light emitted from the face; and forming a channel in the substrate in close proximity to the face, the channel including at least one surface spaced from the face and positioned to receive only a portion of the light from the face and oriented at an angle to the face to reflect said portion away from the photodetector so that the photodetector receives primarily direct light from the face.

14. The method according to claim 13 wherein the channel is formed by etching the major surface of the substrate.

15. The method according to claim 14 where the etching forms at least one V-groove in the channel.

16. The method according to claim 15 wherein the substrate is silicon, and the V-groove has walls in the <111> crystallographic plane of the substrate.

* * * * *